(12) United States Patent
Adachi et al.

(10) Patent No.: US 7,224,072 B2
(45) Date of Patent: May 29, 2007

(54) MOUNTING STRUCTURE FOR BALL GRID ARRAY TYPE IC

(75) Inventors: Kazuteru Adachi, Osaka (JP); Shinji Yoshioka, Osaka (JP)

(73) Assignee: Funai Electric Co., Ltd., Osaka (JP)

( * ) Notice: Subject to any disclaimer, the term of this patent is extended or adjusted under 35 U.S.C. 154(b) by 15 days.

(21) Appl. No.: 10/761,738

(22) Filed: Jan. 21, 2004

(65) Prior Publication Data

US 2004/0150974 A1    Aug. 5, 2004

(30) Foreign Application Priority Data

Jan. 23, 2003    (JP)  ............................ P2003-015142

(51) Int. Cl.
*H01L 23/29*    (2006.01)

(52) U.S. Cl. ..................................... 257/778

(58) Field of Classification Search ........ 257/778–780, 257/734–740, 697, 678
See application file for complete search history.

(56) References Cited

U.S. PATENT DOCUMENTS

| | | | | |
|---|---|---|---|---|
| 5,230,759 | A * | 7/1993 | Hiraiwa | 156/69 |
| 6,061,240 | A * | 5/2000 | Butterbaugh et al. | 361/704 |
| 6,501,658 | B2 * | 12/2002 | Pearson et al. | 361/709 |
| 6,939,742 | B2 * | 9/2005 | Bhatia et al. | 438/117 |
| 2003/0001254 | A1 * | 1/2003 | Jackson et al. | 257/691 |
| 2004/0084764 | A1 * | 5/2004 | Ishimine et al. | 257/706 |
| 2005/0040540 | A1 * | 2/2005 | Haba et al. | 257/778 |

FOREIGN PATENT DOCUMENTS

| | | |
|---|---|---|
| JP | 55-155480 | 12/1980 |
| JP | 10-73107 | 3/1989 |
| JP | 09-129766 | 5/1997 |
| JP | 11-126800 | 5/1999 |
| JP | 3183278 | 7/2001 |
| JP | 2002-246512 | 8/2002 |

OTHER PUBLICATIONS

Patent Abstracts of Japan for Publication No. 2002-246512 dated Aug. 30, 2002 (1 page).
JP Office Action dated Feb. 7, 2007 issued during the prosecution of JP patent application No. 2003-015142 (3 pages).

(Continued)

*Primary Examiner*—Nathan W. Ha
(74) *Attorney, Agent, or Firm*—Osha Liang LLP

(57) ABSTRACT

A mounting structure of a ball grid array type IC includes resin guide ribs provided on opposite sides of a body portion of the ball grid array type IC, engaging pawls formed at distal ends of the guide ribs so as to be locked into locking holes of a board, springs in which the guide ribs are inserted respectively, and height adjusting ribs provided at places slightly inwardly distant from the guide ribs respectively so as to protrude from the body portion. The springs prevent the ball grid array type IC from being strongly pressed against the board when the ball grid array type IC is mounted on the board. The height adjusting ribs adjust the ball grid array type IC to a predetermined height relative to the board.

2 Claims, 4 Drawing Sheets

OTHER PUBLICATIONS

English Translation of JP Office Action dated Feb. 7, 2007 issued during the prosecution of JP patent application No. 2003-015142 (2 pages).

Patent Abstracts of Japan, Publication No. 11-126800 dated May 11, 1999 (2 pages).

Patent Abstracts of Japan, Publication No. 10-173107 dated Jun. 26, 1998 (2 pages).

Patent Abstracts of Japan, Publication No. 09-129766 dated May 16, 1997 (2 pages).

* cited by examiner

MOUNTING STRUCTURE FOR BALL GRID ARRAY TYPE IC

BACKGROUND OF THE INVENTION

1. Field of the Invention

The present invention relates to a mounting structure of a ball grid array type IC which has a plurality of solder balls provided on a bottom surface of its body portion so that the ball grid array type IC can be mounted on a board.

2. Description of the Related Art

A first structure according to the related art is shown in FIGS. 7A, 7B, and 7C. The first structure includes: through-holes 103 formed in at least two corners of a substrate 102 of a semiconductor package 101; and reinforcing leads 106 inserted into the through-holes 103 of the semiconductor package 101 and into through-holes 108 of a mounting board 107 to fix the semiconductor package 101 and the mounting board 107 to each other surely after the semiconductor package 101 is mounted on the mounting board 107 (e.g., see Japanese Patent No. 3,183,278).

In the first structure, the reinforcing leads 106, which are provided as separate elements after the mounting of the semiconductor package 101 on the mounting board 107 in order to reinforce the mounting of the semiconductor package 101 on the mounting board 107, are soldered to the mounting board 107 to prevent the semiconductor package 101 from peeling off after the mounting.

A second structure according to the related art is shown in FIGS. 8A, 8B, and 8C. The second structure includes: a BGA package 202; a plurality of BGA terminals 221 provided on one surface side of the BGA package 202; solder balls 204 formed on the plurality of BGA terminals 221; a plurality of BGA protrusions 203 which are provided on the same surface side as the BGA terminals 221 and each of which has a step protrusion portion 232 in its middle, and a conical protrusion portion 231 extending to its tip; a printed board 201; a plurality of BGA connection terminals 211 which are provided on one surface side of the printed board 201 and which come into contact with the plurality of solder balls 204 on the BGA package 202; and BGA protrusion-inserting holes 205 which are provided on the same surface side as the BGA connection terminals 211 and in which the BGA protrusions 203 having the step protrusion portions 232 on the BGA package 202 are inserted (e.g., see JP-A-2002-246512).

In the second structure, there is however a problem that the BGA protrusions 203 are apt to come out after the BGA protrusions 203 are inserted in the BGA protrusion-inserting holes 205 of the printed board 201. In addition, since the BGA protrusions 203 are provided on four corners of a bottom surface of the BGA package 202, orientation of the BGA package 202 cannot be decided when the BGA package 202 is mounted on the printed board 201. Accordingly, there is a problem that the BGA package 202 is apt to be mounted in an incorrect direction.

SUMMARY OF THE INVENTION

It is an object of the invention to provide a mounting structure of a ball grid array type IC which makes it possible to mount the ball grid array type IC on a board in parallel with the board without inclination, eliminate any soldering defect and eliminate rubbing of the ball grid array type IC against the board during mounting to thereby prevent short-circuiting of terminals and prevent the ball grid array type IC from being mounted in an incorrect direction.

The invention is proposed to solve the problems. According to the invention, there is provided a mounting structure of a ball grid array type IC including: resin guide ribs provided on opposite sides of a body portion of the ball grid array type IC; engaging pawls formed at distal ends of the guide ribs so as to be locked into locking holes of a board; springs in which the guide ribs are inserted respectively; and height adjusting ribs provided at places slightly inwardly distant from the guide ribs respectively so as to protrude from the body portion; wherein the springs prevent the ball grid array type IC from being strongly pressed against the board when the ball grid array type IC is mounted on the board; and the height adjusting ribs adjust the ball grid array type IC to a predetermined height relative to the board.

The invention also provides a mounting structure of a ball grid array type IC including: resin guide ribs provided on opposite sides of a body portion of the ball grid array type IC; engaging pawls formed at distal ends of the guide ribs so as to be locked into locking holes of a board; and elastic bodies provided on the guide ribs; wherein the elastic bodies prevent the ball grid array type IC from being strongly pressed against the board when the ball grid array type IC is mounted on the board.

Preferably, the mounting structure of the ball grid array type IC according to the invention may further includes height adjusting ribs formed on sides of the guide ribs so as to be integrated with the guide ribs respectively.

Preferably, in the invention, the elastic bodies may be made of elastic pieces provided on sides of the guide ribs so as to be integrated with the guide ribs respectively and extend toward the board.

The invention further provides a mounting structure of a ball grid array type IC including a plurality of solder balls provided on a bottom surface of a body portion of the ball grid array type IC for mounting the ball grid array type IC on a board; wherein a pair of anti-rubbing pins to be fitted into insertion holes provided in the board are provided on diagonal corners of the bottom surface of the body portion respectively so as to protrude downward.

The invention further provides a mounting structure of a ball grid array type IC including a plurality of solder balls provided on a bottom surface of a body portion of the ball grid array type IC for mounting the ball grid array type IC on a board; wherein at least one anti-rubbing pin to be fitted in an insertion hole provided in the board is provided on the bottom surface of the body portion so as to protrude downward.

Preferably, in the invention, the anti-rubbing pin may be provided on each of three corners of the body portion so as to protrude downward.

Preferably, in the invention, the anti-rubbing pin may be provided on one corner of the body portion so as to protrude downward while a pin which is shaped like a square in section and which serves as an orienting pin and also as a positioning pin to be inserted into a square hole formed in the board is provided on another corner of the bottom surface of the body portion diagonally opposite the anti-rubbing pin, so as to protrude downward.

DETAILED DESCRIPTION OF THE PREFFERED EMBODIMENTS

Embodiments of a mounting structure of a ball grid array type IC according to the invention will be described below with reference to the drawings.

Figure 1A:
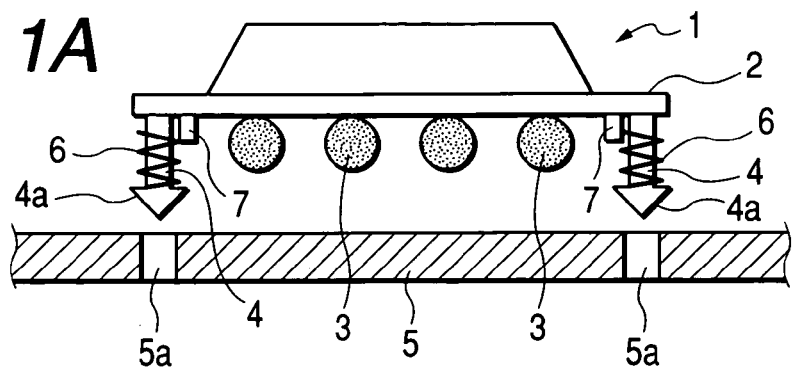
FIGS. 1A and 1B show a mounting structure of a ball grid array type IC according to a first embodiment of the invention, FIG. 1A being a sectional view showing a state of the ball grid array type IC before mounting, FIG. 1B being a sectional view showing a state of the ball grid array type IC after mounting.
Figure 1B:
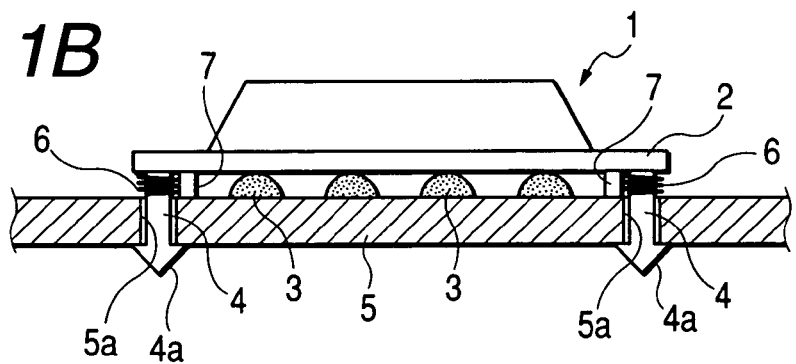

FIGS. 1A and 1B show a mounting structure of a ball grid array type IC according to a first embodiment of the invention.

FIG. 1A is a sectional view showing a state of the ball grid array type IC before mounting, and FIG. 1B is a sectional view showing a state of the ball grid array type IC after mounting.

As shown in FIG. 1A, the mounting structure of the ball grid array type IC 1 according to the first embodiment has: a plurality of solder balls 3 provided on a bottom surface of a body portion 2 of the ball grid array type IC 1; a pair of resin guide ribs 4, 4 provided on opposite sides on the bottom surface of the body portion 2; engaging pawls 4a formed at lower ends of the pair of guide ribs 4, 4 respectively so as to be locked into locking holes 5a of a board 5; springs 6 in which the guide ribs 4, 4 are inserted respectively; and a pair of height adjusting ribs 7, 7 provided at places slightly inwardly distant from the pair of guide ribs 4, 4 respectively so as to protrude from the bottom surface of the body portion 2.

As shown in FIG. 1B, the pair of guide ribs 4, 4 of the body portion 2 of the ball grid array type IC 1 are fitted into the locking holes 5a of the board 5, so that lower ends of the pair of height adjusting ribs 7, 7 abut on a top surface of the board 5.

According the first embodiment, the springs 6 prevent the ball grid array type IC 1 from being strongly pressed against the board 5 when the ball grid array type IC 1 is mounted on the board 5, and the height adjusting ribs 7, 7 adjust the ball grid array type IC 1 to a predetermined height relative to the board 5.

Thus, the ball grid array type IC 1 can be mounted on the board 5 in parallel with the board 5 without inclination to thereby eliminate any soldering defect.

Figure 2:
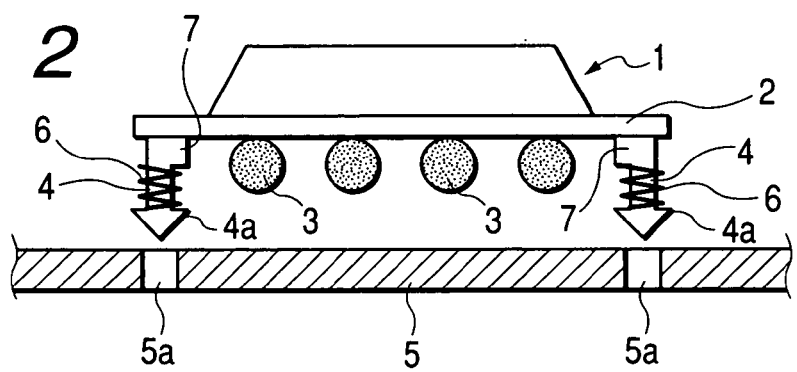
FIG. 2 is a sectional view showing a state of a mounting structure of a ball grid array type IC according to a second embodiment of the invention before mounting.

FIG. 2 is a sectional view showing a state of a mounting structure of a ball grid array type IC according to a second embodiment of the invention before mounting.

As shown in FIG. 2, in the mounting structure of the ball grid array type IC according to the second embodiment, height adjusting ribs 7, 7 are formed on sides of guide ribs 4, 4 so as to be integrated with the guide ribs 4, 4 respectively.

Further, springs 6 are fitted around the guide ribs 4, 4 under the height adjusting ribs 7, 7 respectively.

Figure 3:
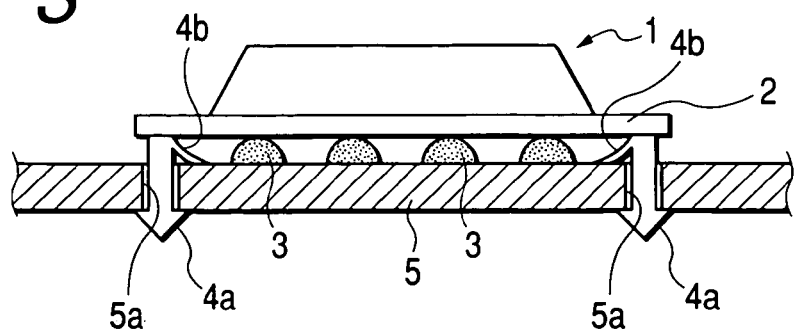
FIG. 3 is a sectional view showing a state of a mounting structure of a ball grid array type IC according to a third embodiment of the invention after mounting.

According to the second embodiment, the height adjusting ribs 7, 7 can be made so robustly as not to be broken. p FIG. 3 is a sectional view showing a state of a mounting structure of a ball grid array type IC according to a third embodiment of the invention after mounting.

In the mounting structure of the ball grid array type IC according to the third embodiment, elastic pieces 4b, 4b which are substituted for the springs 6 are formed on sides of the guide ribs 4, 4 so as to be integrated with the guide ribs 4, 4 respectively and extend downward.

Accordingly, the springs 6 can be dispensed with, so that the number of components can be reduced to simplify the structure to thereby attain reduction in cost.

Figure 4A:
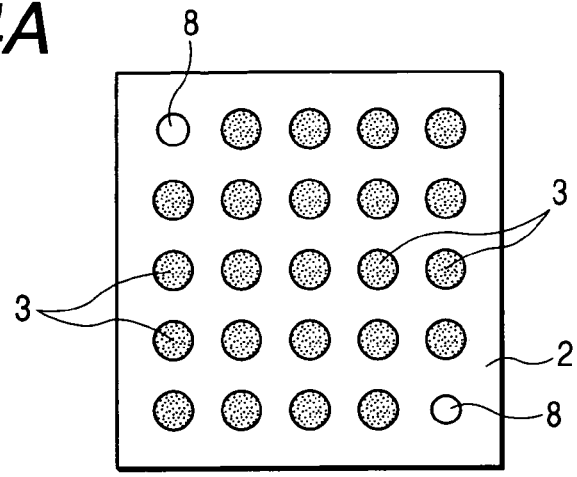
FIGS. 4A and 4B show a mounting structure of a ball grid array type IC according to a fourth embodiment of the invention, FIG. 4A being a bottom view of the ball grid array type IC, FIG. 4B being a sectional view showing a state of the ball grid array type IC after mounting.
Figure 4B:
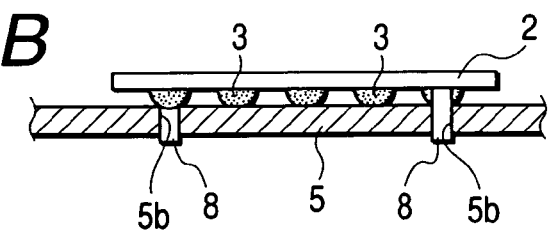

FIGS. 4A and 4B show a mounting structure of a ball grid array type IC according to a fourth embodiment of the invention.

FIG. 4A is a bottom view of the ball grid array type IC, and FIG. 4B is a sectional view showing a state of the ball grid array type IC after mounting.

As shown in FIGS. 4A and 4B, the mounting structure of the ball grid array type IC according to the fourth embodiment has a plurality of solder balls 3 provided on a bottom surface of a body portion 2 of the ball grid array type IC 1 for mounting the ball grid array type IC 1 on a board 5. A pair of ant-rubbing pins 8, 8 to be fitted into insertion holes 5b, 5b provided in the board 5 are provided on diagonal corners of the bottom surface of the body portion 2 so as to protrude downward.

The anti-rubbing pins 8, 8 are aligned with and inserted into the insertion holes 5b, 5b of the board 5.

According to the fourth embodiment, the ball grid array type IC 1 can be prevented from being rubbed against the board 5 because the anti-rubbing pins 8, 8 are inserted into the insertion holes 5b, 5b of the board 5 when the ball grid array type IC 1 is mounted on the board 5.

Figure 5A:
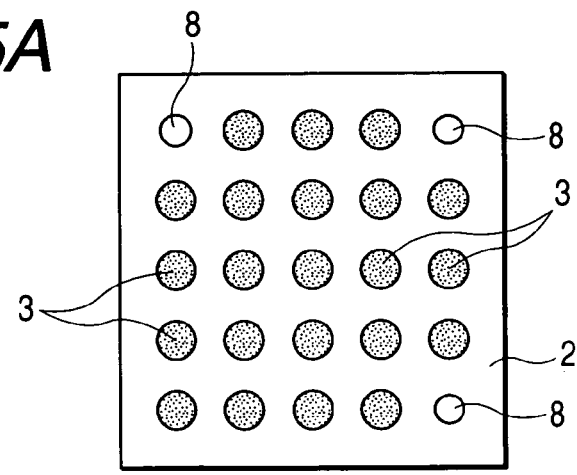
FIGS. 5A and 5B show a mounting structure of a ball grid array type IC according to a fifth embodiment of the invention, FIG. 5A being a bottom view of the ball grid array type IC, FIG. 5B being a sectional view showing a state of the ball grid array type IC after mounting.
Figure 5B:
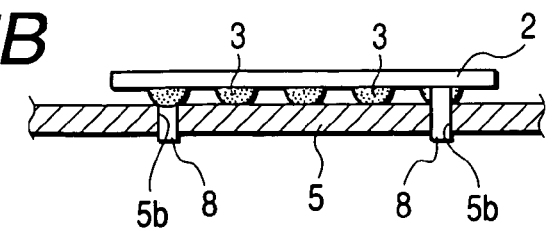

FIGS. 5A and 5B show a mounting structure of a ball grid array type IC according to a fifth embodiment of the invention. FIG. 5A is a bottom view of the ball grid array type IC, and FIG. 5B is a sectional view showing a state of the ball grid array type IC after mounting.

As shown in FIG. 5A, in the mounting structure of the ball grid array type IC according to the fifth embodiment, an anti-rubbing pin 8 is provided on each of three corners of a body portion 2 of the ball grid array type IC so as to protrude downward.

As shown in FIG. 5B, the anti-rubbing pins 8 are inserted into insertion holes 5b formed in three locations of a board 5 respectively to mount the ball grid array type IC 1 on the board 5.

According to the fifth embodiment, the ball grid array type IC 1 can be mounted on the board 5 so as to be oriented in a correct direction because the anti-rubbing pins 8 provided on the three corners of the body portion 2 are inserted into the insertion holes 5b formed in the three locations of the board 5.

Figure 6:
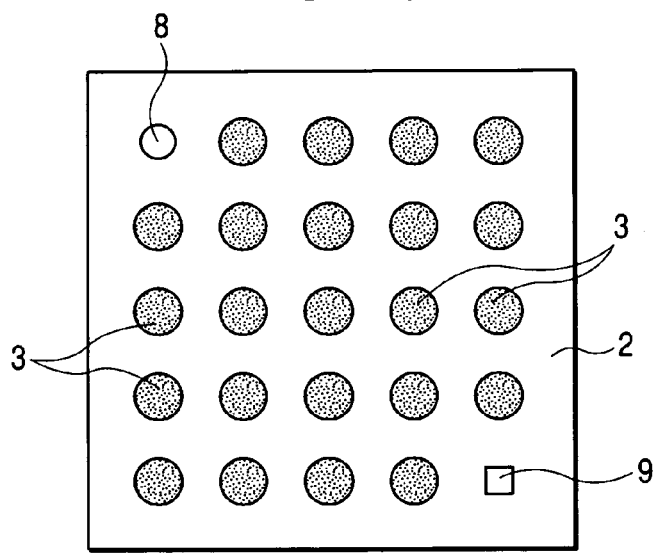
FIG. 6 is a bottom view of a ball grid array type IC in a mounting structure according to a sixth embodiment of the invention.
Figure 7A:
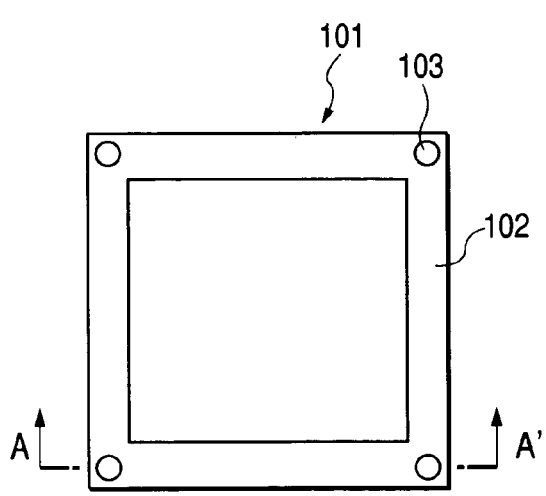
FIGS. 7A, 7B, and 7C show a mounting structure of a ball grid array type semiconductor package according to the related art, FIG. 7A being a plan view of the ball grid array type semiconductor package, FIG. 7B being a side sectional view of the ball grid array type semiconductor package, FIG. 7C being a side sectional view showing a state in which the ball grid array type semiconductor package is mounted on a mounting board.
Figure 7B:
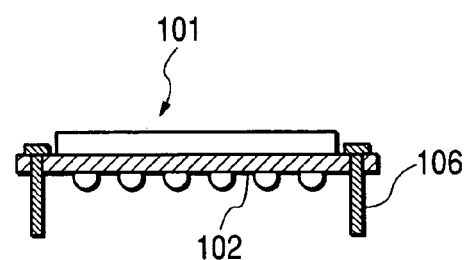
Figure 7C:
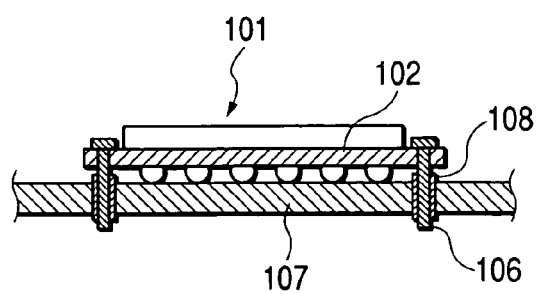
Figure 8A:
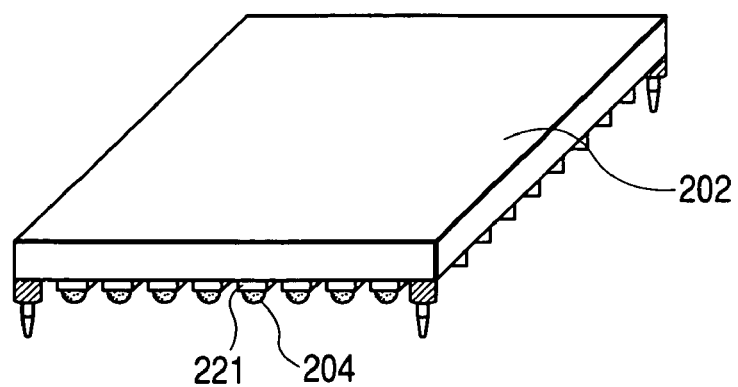
FIGS. 8A, 8B, and 8C show the structure of a BGA package according to the related art, FIG. 8A being a perspective view of the BGA package, FIG. 8B being a sectional view of the BGA package, FIG. 8C being a sectional view of the BGA package mounted on a mounting board before soldered to the mounting board.
Figure 8B:
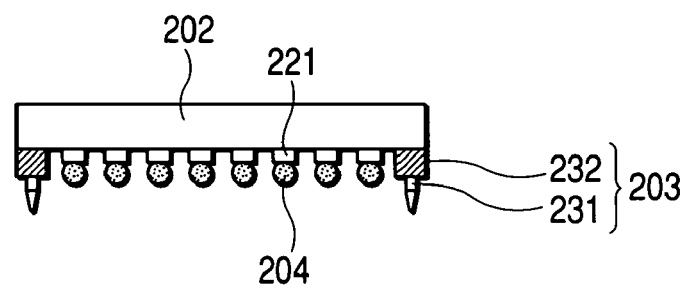
Figure 8C:
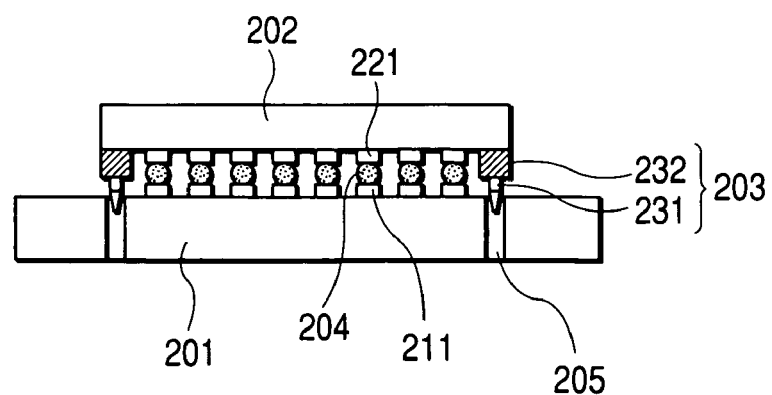

FIG. 6 is a bottom view of a ball grid array type IC in a mounting structure according to a sixth embodiment of the invention.

As shown in FIG. 6, in the mounting structure of the ball grid array type IC according to the sixth embodiment, an anti-rubbing pin 8 is provided on one corner of a body portion 2 of the ball grid array type IC so as to protrude downward while a pin 9 which is shaped like a square in section and which serves as an orienting pin and also as a positioning pin to be inserted into a square hole (not shown) formed in a board 5 is provided on another corner of the bottom surface of the body portion 2 diagonally opposite the anti-rubbing pin 8, so as to protrude downward.

The anti-rubbing pin 8 in one location is inserted into an insertion hole 5b of the board 5 while the orienting pin 9 shaped like a square in section and serving also as a positioning pin is fitted into the square hole (not shown) of the board 5 to mount the ball grid array type IC 1 on the board 5.

According to the sixth embodiment, hence, the combination of the anti-rubbing pin 8 in one location and the orienting pin 9 can prevent the ball grid array type IC 1 from being rubbed against the board 5. In addition, the orienting pin 9 shaped like a square in section permits the ball grid array type IC 1 to be oriented in a correct direction relative to the board and permits the ball grid array type IC 1 to be positioned when the ball grid array type IC 1 is mounted on the board 5.

As described above, in accordance with the invention, there is provided a mounting structure of a ball grid array type IC including: resin guide ribs provided on opposite sides of a body portion of the ball grid array type IC; engaging pawls formed at distal ends of the guide ribs so as to be locked into locking holes of a board; springs in which the guide ribs are inserted respectively; and height adjusting ribs provided at places slightly inwardly distant from the guide ribs respectively so as to protrude from the body portion; wherein the springs prevent the ball grid array type IC from being strongly pressed against the board when the ball grid array type IC is mounted on the board; and the height adjusting ribs adjust the ball grid array type IC to a predetermined height relative to the board. Accordingly, the following advantage can be obtained.

That is, the ball grid array type IC can be mounted on the board in parallel with the board without inclination to eliminate any soldering defect.

According to the invention, there is also provided amounting structure of a ball grid array type IC including: resin guide ribs provided on opposite sides of a body portion of the ball grid array type IC; engaging pawls formed at distal ends of the guide ribs so as to be locked into locking holes of a board; and elastic bodies provided on the guide ribs; wherein the elastic bodies prevent the ball grid array type IC from being strongly pressed against the board when the ball grid array type IC is mounted on the board. Accordingly, the following advantage can be obtained.

That is, the ball grid array type IC can be mounted on the board in a good condition while the ball grid array type IC is prevented from being strongly pressed against the board.

According to the invention, height adjusting ribs may be formed on sides of the guide ribs so as to be integrated with the guide ribs respectively. Accordingly, the height adjusting ribs can be made so robustly as not to be broken.

According to the invention, the elastic bodies may be made of elastic pieces provided on sides of the guide ribs so as to be integrated with the guide ribs respectively and extend downward. Accordingly, the springs can be dispensed with, so that the number of components can be reduced to simplify the structure to thereby attain reduction in cost.

According to the invention, there is further provided a mounting structure of a ball grid array type IC including a plurality of solder balls provided on a bottom surface of a body portion of the ball grid array type IC for mounting the ball grid array type IC on a board, wherein a pair of anti-rubbing pins to be fitted into insertion holes provided in the board are provided on diagonal corners of the bottom surface of the body portion respectively so as to protrude downward. Accordingly, the following advantage can be obtained.

That is, the pair of anti-rubbing pins are inserted in the insertion holes of the board when the ball grid array type IC is mounted on the board, so that the ball grid array type IC can be prevented from being rubbed against the board.

According to the invention, there is further provided a mounting structure of a ball grid array type IC including a plurality of solder balls provided on a bottom surface of a body portion of the ball grid array type IC for mounting the ball grid array type IC on a board, wherein at least one anti-rubbing pin to be fitted in an insertion hole provided in the board is provided on the bottom surface of the body portion so as to protrude downward. Accordingly, the following advantage can be obtained.

That is, the anti-rubbing pin is inserted in the insertion hole of the board when the ball grid array type IC is mounted on the board, so that the ball grid array type IC can be prevented from being rubbed against the board.

According to the invention, the anti-rubbing pin may be provided on each of three corners of the body portion so as to protrude downward. Accordingly, the three anti-rubbing pins provided on the three corners of the body portion are inserted into the insertion holes formed in three locations of the board, so that the ball grid array type IC can be mounted on the board so as to be oriented in a correct direction.

According to the invention, the anti-rubbing pin may be provided on one corner of the body portion so as to protrude downward while a pin which is shaped like a square in section and which serves as an orienting pin and also as a positioning pin to be inserted into a square hole formed in the board is provided on another corner of the bottom surface of the body portion diagonally opposite the anti-rubbing pin, so as to protrude downward. Accordingly, the combination of the anti-rubbing pin in one location and the orienting pin can prevent the ball grid array type IC from being rubbed against the board. In addition, the orienting pin shaped like a square in section permits the ball grid array type IC to be oriented in a correct direction relative to the board and permits the ball grid array type IC to be positioned when the ball grid array type IC is mounted on the board.

What is claimed is:

1. A mounting structure of a ball grid array type IC comprising:
    a plurality of solder balls provided on a bottom surface of a body portion of the ball grid array type IC for mounting the ball grid array type IC on a board:
    wherein at least one anti-rubbing pin to be fitted in an insertion hole provided in the board is provided on the bottom surface of the body portion so as to protrude downward,
    wherein the anti-rubbing pin is provided on each of three corners of the body portion so as to protrude downward.

2. A mounting structure of a ball grid array type IC comprising:
    a plurality of solder balls provided on a bottom surface of a body portion of the ball grid array type IC for mounting the ball grid array type IC on a board;
    wherein at least one anti-rubbing pin to be fitted in an insertion hole provided in the board is provided on the bottom surface of the body portion so as to protrude downward,
    wherein the anti-rubbing pin is provided on one corner of the body portion so as to protrude downward; and
    wherein a pin which is shaped like a square in section and which serves as an orienting pin and also as a positioning pin to be inserted into a square hole formed in the board is provided on another corner of the bottom surface of the body portion diagonally opposite the anti-rubbing pin, so as to protrude downward.

* * * * *

UNITED STATES PATENT AND TRADEMARK OFFICE
CERTIFICATE OF CORRECTION

| | | |
|---|---|---|
| PATENT NO. | : 7,224,072 B2 | Page 1 of 1 |
| APPLICATION NO. | : 10/761738 | |
| DATED | : May 29, 2007 | |
| INVENTOR(S) | : Kazuteru Adachi et al. | |

It is certified that error appears in the above-identified patent and that said Letters Patent is hereby corrected as shown below:

On the Title page:

Item (56), References Cited, the following reference is erroneously missing:
--5,870,286    2/1999    Butterbaugh et al.    361/704--.

Signed and Sealed this

Eleventh Day of September, 2007

JON W. DUDAS
*Director of the United States Patent and Trademark Office*